(12) United States Patent
Pappas

(10) Patent No.: US 10,356,247 B2
(45) Date of Patent: Jul. 16, 2019

(54) ENHANCEMENTS FOR VOIP COMMUNICATIONS

(71) Applicant: Cloud9 Technologies, LLC, New York, NY (US)

(72) Inventor: Andrew Pappas, Hicksville, NY (US)

(73) Assignee: Cloud9 Technologies, LLC, New York, NY (US)

( * ) Notice: Subject to any disclaimer, the term of this patent is extended or adjusted under 35 U.S.C. 154(b) by 225 days.

(21) Appl. No.: 15/222,835

(22) Filed: Jul. 28, 2016

(65) Prior Publication Data

US 2017/0180559 A1 Jun. 22, 2017

Related U.S. Application Data

(60) Provisional application No. 62/268,391, filed on Dec. 16, 2015.

(51) Int. Cl.

| H04L 12/66 | (2006.01) |
|---|---|
| H04M 7/00 | (2006.01) |
| H04L 29/06 | (2006.01) |
| H03G 3/32 | (2006.01) |
| G10L 21/0208 | (2013.01) |
| G10L 21/0316 | (2013.01) |
| H04M 3/00 | (2006.01) |

(52) U.S. Cl.
CPC ......... *H04M 7/006* (2013.01); *G10L 21/0208* (2013.01); *H03G 3/32* (2013.01); *H04L 65/403* (2013.01); *H04L 65/4076* (2013.01); *H04L 65/604* (2013.01); *H04L 65/80* (2013.01); *G10L 21/0316* (2013.01); *G10L 2021/02082* (2013.01); *H04M 3/002* (2013.01)

(58) Field of Classification Search
CPC ... H04M 7/006; H04M 3/002; G10L 21/0208; G10L 2021/02082; G10L 21/0316; H04L 65/80; H04L 65/403; H04L 65/604; H04L 65/4076; H03G 3/32
USPC ................................. 370/329, 352, 353, 401
See application file for complete search history.

(56) References Cited

U.S. PATENT DOCUMENTS

| 6,940,959 | B1* | 9/2005 | Eyre | H04M 1/57 |
| | | | | 379/142.06 |
| 9,020,621 | B1* | 4/2015 | Proctor | H04R 5/04 |
| | | | | 700/94 |
| 2007/0238490 | A1* | 10/2007 | Myrberg | H04M 1/6066 |
| | | | | 455/569.1 |
| 2009/0060216 | A1* | 3/2009 | Sweeney | G10K 11/178 |
| | | | | 381/71.2 |
| 2009/0168673 | A1* | 7/2009 | Kalampoukas | H04L 65/601 |
| | | | | 370/286 |
| 2012/0263019 | A1* | 10/2012 | Armstong-Muntner | ..................... |
| | | | | G01S 15/003 |
| | | | | 367/118 |
| 2013/0060567 | A1* | 3/2013 | Konchitsky | G10L 15/20 |
| | | | | 704/233 |
| 2014/0064507 | A1* | 3/2014 | Su | H03G 3/3089 |
| | | | | 381/71.1 |

(Continued)

*Primary Examiner* — Chuong T Ho
(74) *Attorney, Agent, or Firm* — FisherBroyles LLP; Richard M. Lehrer

(57) ABSTRACT

VoIP telephone systems and methods are provided for use in a noisy listening environment. The systems and methods provide high quality voice broadcast into the noisy listening environment through independent voice channels which makes it easier for the human brain to discern broadcast words from the background noise.

21 Claims, 5 Drawing Sheets

(56) References Cited

U.S. PATENT DOCUMENTS

| | | | | |
|---|---|---|---|---|
| 2014/0064508 A1* | 3/2014 | Su | ............... | H03G 3/3089 |
| | | | | 381/71.6 |
| 2014/0126737 A1* | 5/2014 | Burnett | ............... | H04R 3/005 |
| | | | | 381/71.6 |
| 2014/0274218 A1* | 9/2014 | Kadiwala | ............... | H04M 1/6041 |
| | | | | 455/570 |
| 2015/0287422 A1* | 10/2015 | Short | ............... | G01S 7/288 |
| | | | | 704/205 |
| 2016/0227025 A1* | 8/2016 | Soby | ............... | H04M 19/026 |
| 2016/0227284 A1* | 8/2016 | Ordille | ............... | H04N 21/478 |

* cited by examiner

ENHANCEMENTS FOR VOIP COMMUNICATIONS

FIELD OF THE TECHNOLOGY

One or more embodiments of the disclosed technology relate(s) generally to telecommunications, and more specifically but not exclusively to enhancing Voice over Internet Protocol (VoIP) communications for noisy listening environments.

BACKGROUND OF THE TECHNOLOGY

In noisy environments it becomes difficult to hear and/or concentrate on the sound transmitted over a telephone or speakerphone. This is a particularly, but not exclusively, relevant problem on trading floors in the financial industry. Trading floor environments present a hostile environment for acoustics. There are many reflective surfaces creating echo and reverberation, personnel are within close proximity to one another, each listening to different audio sources, and there is/are typically streaming video and/or TV audio playing in the background. At the same time, traders need to hear short quotes from bidders transmitted over their speakerphones. This causes traders to become fatigued and results in them having to ask the person on the far end of the communication channel to repeat the bid. In a world where seconds may equate to thousands and possibly millions of dollars, avoiding this type of fatigue becomes very relevant.

Support for end-to-end voice calls using Internet Protocol ("IP") networks such as the Internet as an alternative to traditional public switched telephone networks ("PSTN") is well known. VoIP is voice that is packetized as defined by IP, and communicated over the Internet for telephone-like communication. Individual VoIP packets may travel over different network paths to reach the final destination where the packets are reassembled in correct sequence to reconstruct the voice information.

While transmission over the Internet is inexpensive relative to transmission over the PSTN, the Internet poses problems which are not present in the PSTN. In particular, the transmission speed between any two users can change drastically due to the dynamic number of users sharing the common transmission medium, their bandwidth requirements, the capacity of the transmission medium, and the efficiency of the network routing and design. Other problems associated with VoIP are the variability of the quality of the signal received at the destination (i.e. the number of transmission errors such as packet loss, packet delay, corrupted packets, etc.). Thus, while the Internet may be a suitable medium for voice communications the suitability is not always consistent.

Many businesses employ customer premise switches ("CPS")(e.g. Key Signaling Units ("KSU"), Private Branch Exchanges ("PBX"), Centrexes or the like) for routing calls, from, among other places, the business equipment to destination telephone equipment. Systems currently exist which monitor the quality of service (QoS) of an unreliable network (e.g. the Internet) to determine which communication path should be chosen to obtain the best QoS. However, these systems do not address the issues discussed above regarding a noisy environment.

It would thus be advantageous to create a system for use with a VoIP communications system which addresses issues related to listening in a noisy environment. It would be advantageous to create such a system that provides high quality voice and makes it easier for the human brain to discern the spoken words from the background noise.

BRIEF SUMMARY OF THE TECHNOLOGY

Many advantages will be determined and are attained by one or more embodiments of the disclosed technology, which in a broad sense provides a VoIP telephone system which provides high quality voice and makes it easier for the human brain to discern spoken words transmitted over the VoIP communication channel from background noise in the listening environment.

One or more embodiments of the technology provides a communication system for use in a noisy listening environment. The communication system includes a customer premises equipment (CPE) configured to transmit and receive voice signals over a packet switched communications network. The system also includes at least one speaker in electrical communication with the CPE. The speaker is capable of producing sound over multiple different (independent) voice channels. The CPE is also configured to provide multiple voice signals to the speaker such that it provides at least one of the voice signals to produce sound over one of the channels and provides at least another voice signal to produce sound over a different channel.

One or more embodiments of the technology provides a method of regulating voice signals emitted from a communication system in a noisy listening environment. The method includes a CPE receiving voice signals which have been transmitted over a packet switched network. The CPE transmits at least two of the received voice signals over separate voice channels for broadcasting into the noisy listening environment.

One or more embodiments of the technology provides a Voice over Internet Protocol (VoIP) phone for use in a noisy listening environment. The phone is configured to receive packetized voice signals from a network and broadcast corresponding analog voice signal into the noisy listening environment and is configured to receive analog voice signals from the noisy listening environment and transmit corresponding packetized voice signals over the network. The phone includes a speaker capable of broadcasting sound over different channels and a microphone capable of receiving voice from the noisy listening environment. The phone also includes a proximity effect detection module configured to detect low energy signals received by the microphone and reduce the low energy signals to improve an audio quality of the received voice. Further, the phone includes a voice routing module configured to respectively route multiple voice signals received from the network to different channels.

The technology will next be described in connection with certain illustrated embodiments and practices. However, it will be clear to those skilled in the art that various modifications, additions and subtractions can be made without departing from the spirit or scope of the claims.

BRIEF DESCRIPTION OF THE DRAWINGS

For a better understanding of the technology, reference is made to the following description, taken in conjunction with the accompanying drawings, in which like reference characters refer to like parts throughout, and in which.

The technology will next be described in connection with certain illustrated embodiments and practices. However, it will be clear to those skilled in the art that various modifications, additions, and subtractions can be made without departing from the spirit or scope of the claims.

DETAILED DESCRIPTION OF THE TECHNOLOGY

Figure 1:
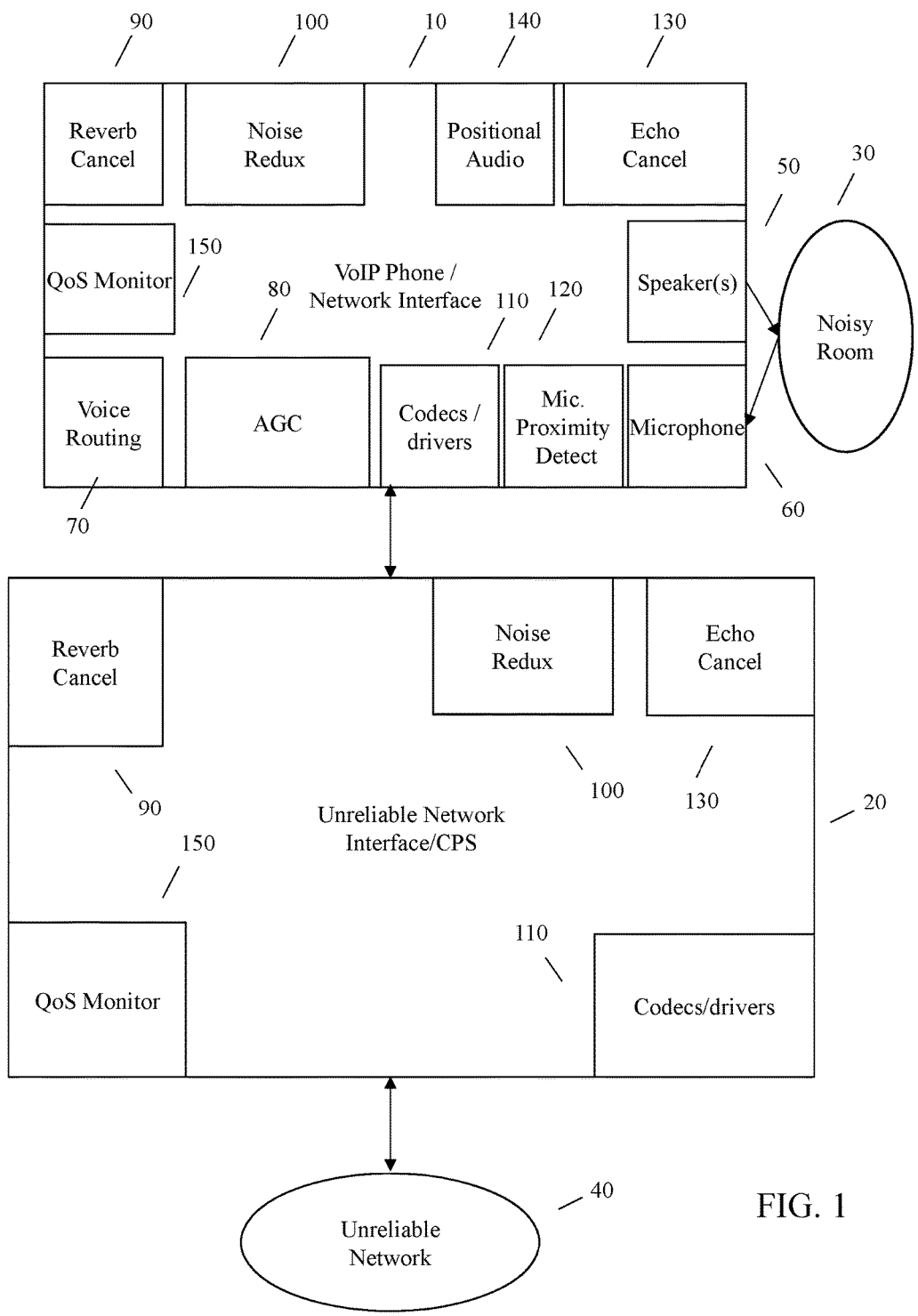
FIG. 1 provides a block diagram illustrating various exemplary components employed in a communication system that makes it easier for the human brain to discern spoken words from background noise in a noisy listening environment in accordance with one or more embodiments of the disclosed technology.

Referring to the figures in detail wherein like reference numerals identify like elements throughout the various figures, there is illustrated in FIGS. 1-5 systems and methods for optimizing VoIP and/or frame relay communications system for noisy listening environments. The following description (as illustrated in FIG. 1) will be limited to speakerphones 10 which include both a microphone 60 for receiving sound and transmitting the sound over a communication channel/path and a speaker 50 for broadcasting sound received from the communication channel. Additionally, the speakerphone 10 could be a computer running a software program that enables the computer to act as a terminal for making and receiving calls. In such a configuration, the computer running the software program will be considered the speakerphone 10, may include a network interface 20 and could potentially act as the CPS 20 as well. Those skilled in the art will recognize that in peer to peer configurations, a CPS is not required and thus may be eliminated. Additionally, the network interface may be a separate device such as a gateway server or it may be included as part of the VoIP phone. The computer could include its own speaker 50 and microphone 60 and/or an external speaker and/or microphone could be connected to the computer. The system could use any configuration of speaker/microphone pairs (including handsets), speakers only and/or microphones only. Further, while the following description will be limited to traders at a trading desk, those skilled in the art will recognize that one or more embodiments of the technology can be utilized in other environments as well and that this is not a limiting factor.

Discussion of an embodiment, one or more embodiments, an aspect, one or more aspects, a feature, one or more features, or a configuration or one or more configurations is intended to be inclusive of both the singular and the plural depending upon which provides the broadest scope without running afoul of the existing art and any such statement is in no way intended to be limiting in nature. Technology described in relation to one or more of these terms is not necessarily limited to use in that particular embodiment, aspect, feature or configuration and may be employed with other embodiments, aspects, features and/or configurations where appropriate.

While not illustrated, each device in the system (speakerphone 10, CPS 20) will include, among others, common elements. These are conventional elements and thus their operation and interconnections will not be further discussed herein. Those or ordinary skill in the art are deemed to understand how elements such as a processor, memory, storage, input/output ("I/O") interface, communications interface and clock are electrically connected and how they send and/or receive messages via a bus. While these elements are not illustrated in the block diagrams, those skilled in the art will recognize that the speakerphones 10 and the CPS 20 each includes, among others, these elements and that the interaction between two or more of these elements is required to perform the functions of the disclosed technology.

Figure 2:
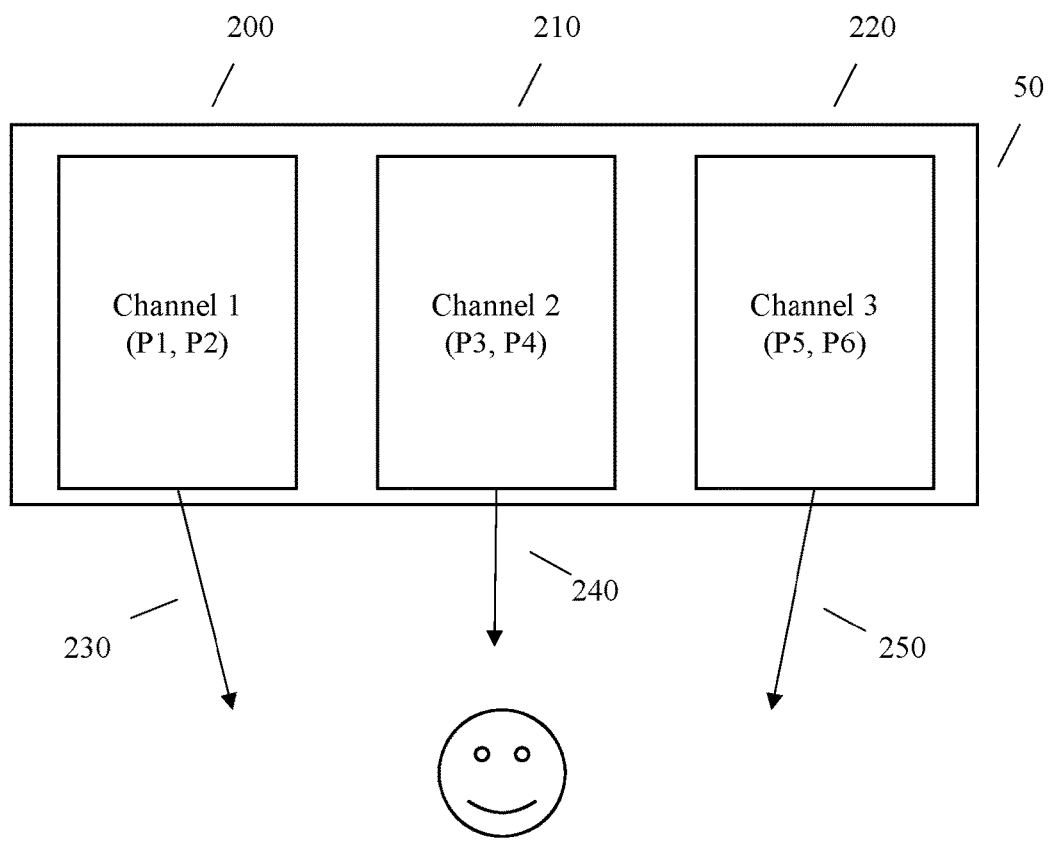
FIG. 2 provides a block diagram of an exemplary speaker for use with the communication system of FIG. 1 in accordance with one or more embodiments of the disclosed technology.

One or more of the following components is/are provided in a VoIP system for addressing issues related to receiving voice calls in a noisy listening environment 30. The system provides high definition ("HD") audio. 16 KHz audio is the full human audio bandwidth simulating conversation as if two people are speaking next to each other. HD audio can be achieved using HD coder/decoders ("codecs") 110 and/or HD speaker systems 50. There are a number of conventional HD codecs 110, codec drivers 110 and speakers 50 available in the marketplace and thus there will not be a further description of how to create HD voice using VoIP. Another component that may be employed to address issues related to listener fatigue is the use of high quality codecs 110 which compensate for packet loss on the network and allow for audio with no voice drops. Once again, there are a number of conventional high quality codecs 110 and codec drivers 110 which compensate for packet loss available in the marketplace and thus there will not be a further description of how to use such codecs in a VoIP communication system. While omnidirectional speakers 50 may be employed, it is more beneficial to use one or more directional speakers 50. The human brain better discerns sounds if those sounds do not all appear to originate from the same source. Accordingly, as illustrated in FIG. 2 the system may employ stereo speakers 50 (illustrated as a single box) to create three separate sound sources left 230, middle 240, and right 250. Although those skilled in the art will recognize that multiple directed or quadrophonic speakers could also be used. If the trader is participating in a conference call with six different parties (P1-P6) each party will be transmitted through only one of these three channels (Channel 1, 2, 3). Thus, for example, the first 2 parties (P1, P2) will transmit through the left channel 200 when they speak, the second 2 parties (P3, P4) will transmit through the middle channel 210 when they speak and the last 2 parties (P5, P6) will transmit through the right channel 220 when they speak. By way of a non-limiting example, with a pair of stereo speakers, parties P1 and P2 may broadcast 230 out of the left speaker (Channel 1), parties P3 and P4 may broadcast 240 out of both the right and left speakers (Channel 2) and parties P5 and P6 may broadcast 250 out of the right speaker (Channel 3). Those skilled in the art will recognize that the system may be employed with fewer than 6 remote participants or more than 6 remote participants and still fall within a scope of one or more of the claims. Those skilled in the art will also recognize that the channel assigned to each party is a design choice and it could be based on a round robin assignment, a serial assignment a random assignment a manual assignment or any other assignment. While not preferred, it is also possible that a party will be assigned to more than one channel and/or the channel assigned to a particular party could change during the call. Further, the number of channels need not be limited to 3 and the number of channels assigned to each party need not be the same. There could be two channels or more than 3 channels employed. In the above example of 2 parties per channel, the listener will get used to two of the parties (P1, P2) originating from the left 230, two (P3, P4) from the middle 240, and two (P5, P6) from the right 250. This allows the human brain to better understand the sound than if all six were coming from the same source point.

Figure 3:
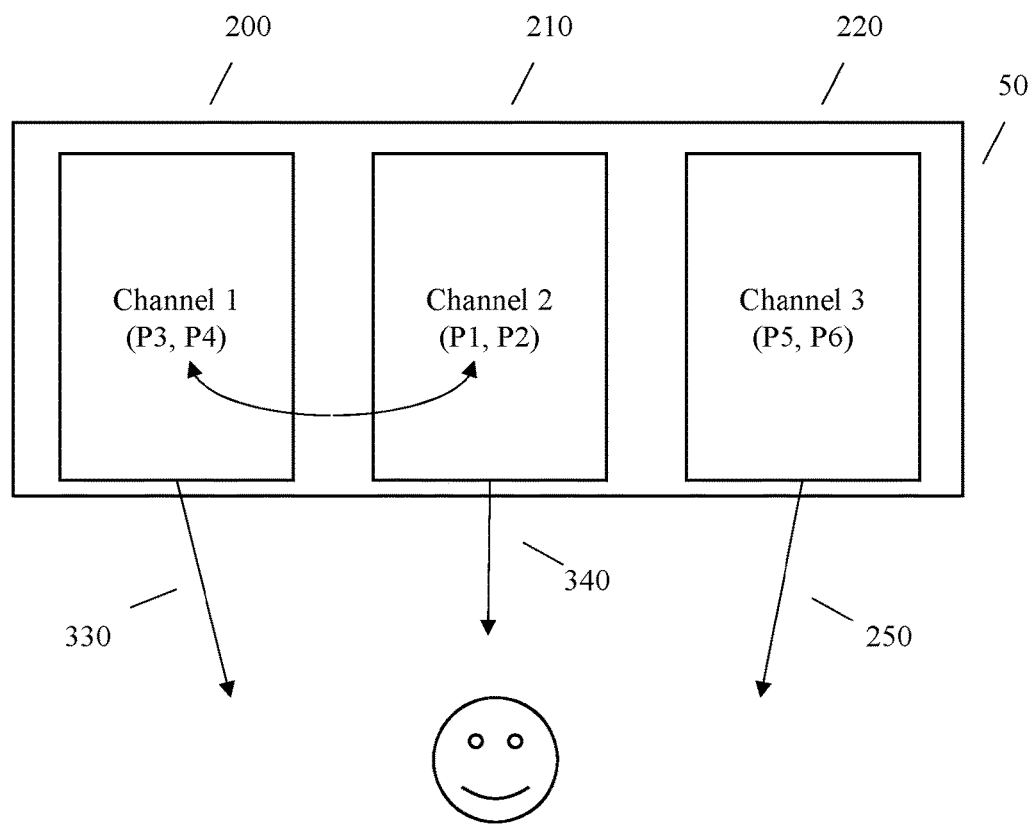
FIG. 3 provides a block diagram of the exemplary speaker of FIG. 2 illustrating positional audio in accordance with one or more embodiments of the disclosed technology.
Figure 4:
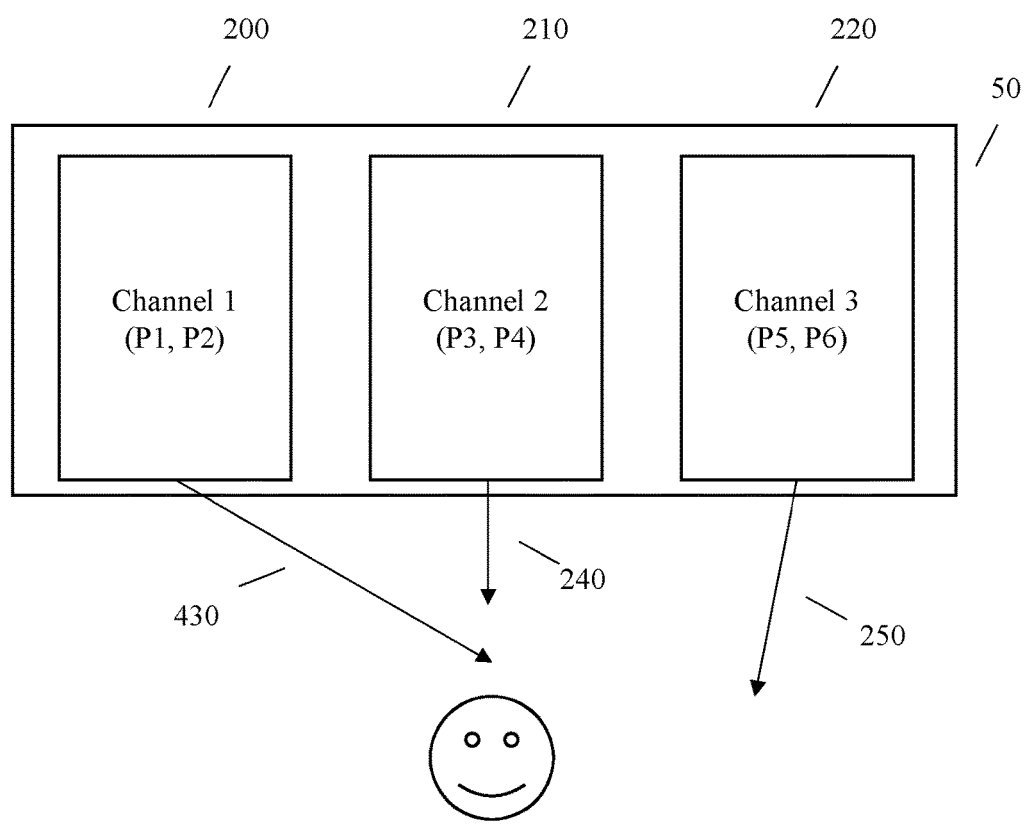
FIG. 4 provides another block diagram of the exemplary speaker of FIG. 2 illustrating positional audio in accordance with one or more embodiments of the disclosed technology; and, FIG. 5 provides a flow chart illustrating an exemplary method for making it easier for the human brain to discern spoken words, broadcast from a communications network, from background noise in a noisy listening environment in accordance with one or more embodiments of the disclosed technology.

As illustrated in FIGS. 3, 4 the system may include a positional audio option for the user. Positional audio allows the user to select a particular party (e.g. P1, P2) or parties and have that/those parties transmit 340 through the center channel 210 (FIG. 3). It also increases the audio output for that/those party/parties while they are transmitting through the center channel. Alternatively, it allows the direction of the audio from the channel to move to center 430 and increases the volume (FIG. 4). Those skilled in the art will recognize that this adjustment could be permanent (for the duration of the call) or more preferably temporary (for the duration while the user continues to select the party or parties). Those skilled in the art will also recognize that while the center channel 210 is preferable, this is merely a design choice and the channel choice could default to any one or more of the channels and/or could be selected by the user. Additionally, the user may be provided the choice of making the change temporary or permanent.

Another component of the system that may be employed to address listener fatigue is automatic gain control ("AGC") 80 (FIG. 1). The noise in the room 30 will not usually remain at a consistent level. As such, when the volume of the room noise increases it becomes harder to hear the person on the call speaking which causes the trader to strain in order to hear the same party speaking. Additionally, or alternatively, if the level of the person speaking suddenly decreases (e.g. the person begins to speak at a lower volume or the communication channel degrades, etc.) then it becomes harder to hear the person speaking which also causes the trader to strain in order to hear the same party speaking. Additionally, or alternatively, if the volume of the call suddenly becomes louder, it may become irritating to the trader which causes a different type of listener fatigue. Essentially, by keeping the relative volume of the person speaking on the phone to a constant level relative to the noise in the room it minimizes the effort with which the trader needs to listen and thus minimizes the fatigue caused by changes in volume. AGC can be achieved using one or more server adaptors, CPS adaptors and/or phones with built-in AGC. Other components of the system which may be employed to counteract issues related to receiving a voice call in a noisy listening environment include reverb management 90, echo cancellation 130 and noise reduction 100. Acoustic echo cancellation 130 may be achieved using existing acoustic echo cancellation such as an adaptive block frequency domain based algorithm or some other conventional acoustic echo cancellation 130. The same is true for noise reduction 100. The reverberation management 90 may be controlled using conventional technology that is easily modified for the application. It is also based on an adaptive frequency domain algorithm.

In addition to the above, a smart, per individual peer adaptive volume control may be employed which dynamically adjusts loud or soft users based on a change in volume control inputted by the trader. In other words, each party (or remote phone) may have a volume control associated therewith. In the event that the trader raises or lowers the volume of one of the remote phones while multiple people are speaking at the same time (e.g. because the person speaking on that phone line is a loud or quiet speaker), the system will attempt to normalize the volume of all of the parties by raising the level of the quiet speakers while maintaining or lowering the volume of the loud speaker. The system may raise or lower the actual volume and/or it may raise or lower a threshold value used to determine whether or not to raise or lower a volume. Additionally, directional microphone proximity detection 120 and compensation algorithm may be employed, which aims to reduce the large increase in low frequency energy when a user speaks very close to the microphone. A directional microphone with good low, mid, and high frequency response at a distance beyond a few inches is desirable for high quality audio transmission. However, in a high noise environment, the user may think that speaking much closer to the microphone will improve the signal to noise ratio. However, when the user approaches the microphone 60, the low frequency energy from the user is amplified (due to the proximity effect) which may cause distortion and a boomy/bassy voice which may actually be more difficult to understand at the far end of the channel. This problem is exaggerated if the distant end user is also located in a noisy environment that has a lot of low frequency energy/noise. Applying a proximity detection algorithm 120 that dynamically adjusts the low frequency speech energy to rebalance the response improves intelligibility and reduces fatigue. Proximity effect detection 120 can be accomplished using a measurement of the spectral flux of the input signal, which measures how the power spectrum is changing for specific frequency bins over time. Once the spectral flux derived proximity indication is set the energy of these bins is reduced or a time domain filter (e.g. a high pass filter) is applied to reduce the energy and improve the audio quality. The amount of low frequency energy adjustment can be configurable based on the type of microphone used if it is known and characterized prior to operation.

Figure 5:
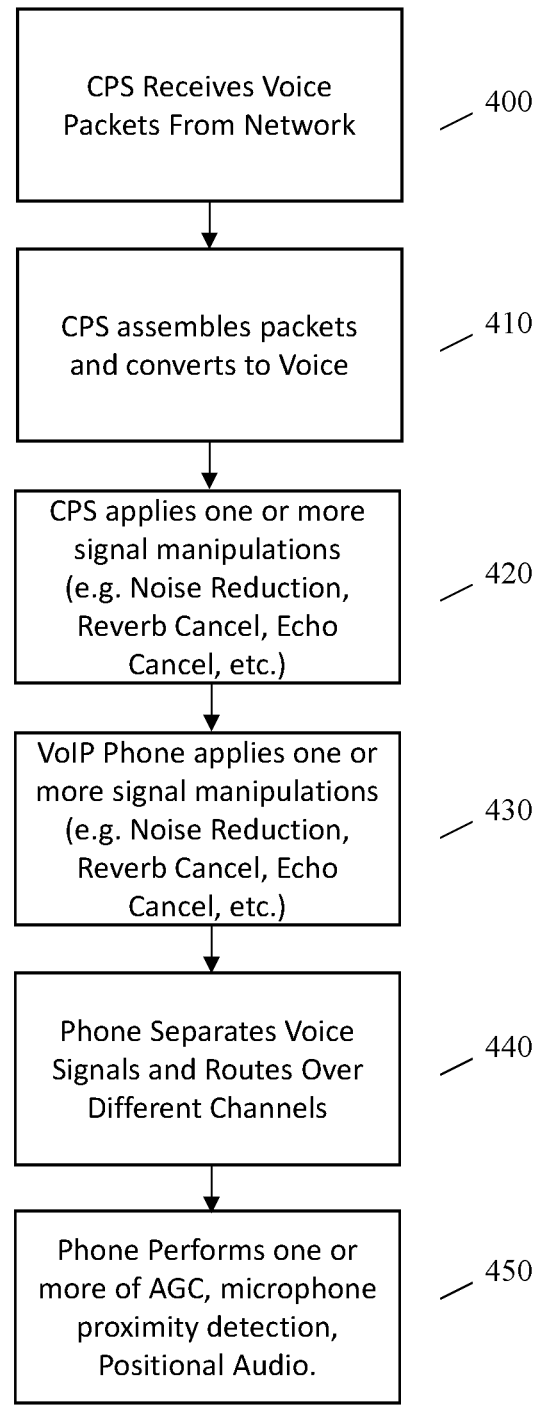

As illustrated in FIG. 1, one or more of these features may be included in the speakerphone 10, the network interface/CPS 20 or both. As illustrated in FIG. 5, the network interface/CPS 20 receives the packets from the network 400 converts the packets to voice 410 and determines whether or not to apply noise reduction, reverb cancellation and/or echo cancellation 420. It then passes the voice signal to the VoIP phone which may perform additional noise reduction, reverb cancellation and/or echo cancellation 430. The VoIP phone also separates the voice signals and routes them over the various channels of the speaker(s) 440. Those skilled in the art will recognize that the VoIP phone could perform the operations of the network interface/CPS without the need for a separate CPS. By way of a non-limiting example, the VoIP phone may operate peer to peer (P2P) with other remote phones. In such a configuration, there would be no need for a CPS and the network interface could be incorporated into the phone. While the conversation is taking place, the speakerphone detects the volume of the background noise and compares it to the speaking level of the voice being transmitted from the far end of the communication channel. If the level of the voice drops or rises below or above a predetermined threshold (e.g. a signal to noise ratio (SNR), or a range of SNRs), the AGC will adjust the volume of the speakerphone accordingly 450.

Having thus described preferred embodiments of the technology, advantages can be appreciated. Variations from the described embodiments exist without departing from the scope of the technology. Thus it is seen that systems and methods are provided for optimizing the sound of spoken words transmitted through a VoIP telephone system when background noise is present in the listening/speaking environment. Although particular embodiments have been disclosed herein in detail, this has been done for purposes of illustration only, and is not intended to be limiting with respect to the scope of the claims, which follow. In particular, it is contemplated by the inventors that various substitutions, alterations, and modifications may be made without departing from the spirit and scope of the technology as defined by the claims. Other aspects, advantages, and modifications are considered to be within the scope of the following claims. The claims presented are representative of the technology disclosed herein. Other, unclaimed technology is also contemplated. The inventors reserve the right to pursue such technology in later claims.

Insofar as embodiments of the technology described above are implemented, at least in part, using a computer system, it will be appreciated that a computer program for implementing at least part of the described methods and/or the described systems is envisaged as an aspect of the technology. The computer system may be any suitable apparatus, system or device, electronic, optical, or a combination thereof. For example, the computer system may be a programmable data processing apparatus, a computer, a Digital Signal Processor, an optical computer or a microprocessor. The computer program may be embodied as source code and undergo compilation for implementation on a computer, or may be embodied as object code, for example.

It is also conceivable that some or all of the functionality ascribed to the computer program or computer system aforementioned may be implemented in hardware, for example by one or more application specific integrated circuits and/or optical elements. Suitably, the computer program can be stored on a carrier medium in computer usable form, which is also envisaged as an aspect of the technology. For example, the carrier medium may be solid-state memory, optical or magneto-optical memory such as a readable and/or writable disk for example a compact disk (CD) or a digital versatile disk (DVD), or magnetic memory such as disk or tape, and the computer system can utilize the program to configure it for operation. The computer program may also be supplied from a remote source embodied in a carrier medium such as an electronic signal, including a radio frequency carrier wave or an optical carrier wave.

It is accordingly intended that all matter contained in the above description or shown in the accompanying drawings be interpreted as illustrative rather than in a limiting sense. It is also to be understood that the following claims are intended to cover all of the generic and specific features of the technology as described herein, and all statements of the scope of the technology which, as a matter of language, might be said to fall there between.

Having described the technology, what is claimed as new and secured by Letters Patent is:

1. A communication system for use in a noisy listening environment, said communication system comprising:
   a customer premises equipment (CPE) configured to transmit and receive voice signals over a packet switched communications network;
   a microphone that receives voice from said noisy listening environment;
   a proximity effect detector that detects low energy signals received by said microphone and reduces said low energy signals to improve an audio quality of said received voice;
   at least one speaker in electrical communication with said CPE; said at least one speaker capable of producing sound over a plurality of channels;
   said CPE configured to provide a plurality of voice signals received from the communication network to said at least one speaker; wherein said CPE is configured to provide at least one of said plurality of voice signals to produce sound over one of said plurality of channels into the noisy environment; and,
   said CPE is configured to provide at least another of said plurality of voice signals to produce sound over another of said plurality of channels into the noisy environment.

2. The communication system according to claim 1 further including a plurality of acoustic processing measures configured to regulate a sound level emitted from said at least one speaker in relation to a sound level of said noisy listening environment.

3. The communication system according to claim 2 wherein said plurality of acoustic measures include at least two measures selected from the group of acoustic measures including automatic gain control, reverb management, echo cancellation, noise reduction and directional audio.

4. The communication system according to claim 1 wherein said at least one speaker includes a plurality of speakers.

5. The communication system according to claim 1 wherein said plurality of channels include a right channel, a center channel and a left channel.

6. The communication system according to claim 5 wherein said right channel includes a right speaker, said left channel includes a left speaker and said center channel includes both said right and left speakers.

7. The communication system according to claim 1 wherein said CPE is a Voice over Internet Protocol (VoIP) phone.

8. The communication system according to claim 1 further including a microphone in electrical communication with said CPE; wherein said CPE is configured to apply proximity effect detection to said microphone.

9. A method of regulating voice signals emitted from a communication system in a noisy listening environment comprising:
   a customer premise equipment ("CPE") having a proximity effect detector, the CPE receiving a plurality of voice signals over a packet switched network; and,
   said CPE transmitting at least two of said plurality of voice signals over separate voice channels for broadcasting into said noisy listening environment;
   said CPE receiving a voice signal from the noisy environment,
   said proximity effects detector detecting a low energy signal received from the noisy environment and reducing said low energy signal to improve an audio quality of said received voice.

10. The method according to claim 9 further including said CPE regulating a sound level of at least one of said plurality of voice signals broadcast in relation to a sound level of said noisy listening environment.

11. The method according to claim 10 wherein said regulating includes at least two operations selected from the group of operations including automatically regulating a gain of the broadcast, managing reverb, cancelling echo, reducing noise and focusing said broadcast.

12. The method according to claim 9 wherein said CPE transmits said at least two of said plurality of voice signals over separate voice channels of a single speaker.

13. The method according to claim 9 wherein said CPE transmits said at least two of said plurality of voice signals over separate voice channels of a plurality of speakers.

14. The method according to claim 9 wherein said at least two of said plurality of voice signals includes at least three voice signals and said CPE transmits said at least three voice signals respectively over a right, left and middle voice channel of a speaker for broadcasting into said noisy listening environment.

15. The method according to claim 14 further including said CPE providing an ability for a user to select the right, left or middle voice channel for one of said at least three voice signals.

16. The method according to claim 15 wherein said selection is temporary.

17. The method according to claim 9 further including said CPE receiving voice signals from said noisy listening environment via a microphone and said CPE applying proximity effect detection to said microphone.

18. A Voice over Internet Protocol (VoIP) phone for use in a noisy listening environment, said VoIP phone configured to receive packetized voice signals from a network and broadcast analog voice signal into the noisy listening environment and configured to receive analog voice signals from the noisy listening environment and transmit packetized voice signals over the network; said VoIP phone comprising:
 a speaker that broadcasts sound over a plurality of different channels into the noisy environment;
 a microphone that receives voice from said noisy listening environment;
 a proximity effect detector that detects low energy signals received by said microphone and reduces said low energy signals to improve an audio quality of said received voice; and,
 a voice router that respectively routes a plurality of voice signals received from said network to said plurality of different channels.

19. The VoIP phone according to claim 18 further including an automatic gain control module configured to adjust a volume of said analog voice broadcast into the noisy listening environment based on a level of noise detected in the noisy listening environment.

20. The VoIP phone according to claim 18 wherein said microphone is a directional microphone.

21. The VoIP phone according to claim 18 wherein said speaker includes a plurality of directional speakers.

* * * * *